United States Patent [19]

Matsunaga et al.

[11] Patent Number: 4,684,974
[45] Date of Patent: Aug. 4, 1987

[54] ELECTRODE CONNECTION STRUCTURE OF FLAT DEVICE

[75] Inventors: Koji Matsunaga, Hirakata; Kenzo Hatada, Katano, both of Japan

[73] Assignee: Matsushita Electric Industrial Co. Ltd., Osaka, Japan

[21] Appl. No.: 797,484

[22] Filed: Nov. 13, 1985

[30] Foreign Application Priority Data

Nov. 16, 1984 [JP] Japan ................. 59-242886

[51] Int. Cl.[4] .................. H01L 23/32; H01L 23/12; H01L 21/603
[52] U.S. Cl. .................................. 357/68; 357/80; 357/70; 357/79; 357/75
[58] Field of Search .................. 339/17 CF, 75 M; 357/74, 68, 75, 80, 70, 79

[56] References Cited

U.S. PATENT DOCUMENTS 4,381,131 4/1983 Demianiuk ................ 339/75 M

Primary Examiner—Andrew J. James
Assistant Examiner—S. V. Clark
Attorney, Agent, or Firm—Stevens, Davis, Miller & Mosher

[57] ABSTRACT

A film carrier on which semiconductor devices are disposed and which is excised so as to have a predetermined size and has leads in at least two directions is placed on a connecting frame member which has a cushion material at one end and in which a circuit substrate is fixed to the other end. The lead at one end of the film carrier is disposed on the cushion material and the opposite surface of this lead contacts with a group of external lead-out electrodes of the flat device mounted on the cushion material. The lead at the other end of the film carrier is connected to the circuit substrate. A supporting frame member is fixed to the connecting frame member such that it comes into pressure contact with the opposite surfaces of the group of external lead-out electrodes of the flat device.

3 Claims, 4 Drawing Figures

ELECTRODE CONNECTION STRUCTURE OF FLAT DEVICE

BACKGROUND OF THE INVENTION

The present invention relates to an electrode connection structure to connect a group of external lead-out electrodes of a flat device and a group of output electrodes of a film carrier on which semiconductor devices to drive the flat device are installed in a flat display device such as a liquid crystal display device, a plasma display device, an EL display device, or the like, and in a flat device such as a sensor array or the like such as a one-dimensional image pickup device, a photo detector, or the like.

A conventional technology will now be described using a flat display device.

To drive a flat display device, a group of external lead-out electrodes of the display device are needed to be connected to a group of output electrodes of a circuit substrate on which driving semiconductor devices are installed, and a few methods have been used for this purpose of connection.

For example, as shown in FIG. 2, to connect a group of output electrodes formed at the end of a circuit substrate 2 in which a plurality of driving semiconductor devices 1 are installed on the same substrate with a group of external lead-out electrodes 4 of a display device 6, an anisotropic conductive rubber 5 in which conductive portions and nonconductive portions are alternately arranged is interposed between both of those groups of electrodes and pressed so as to be come into contact therewith. As shown in FIG. 3, a flexible circuit substrate 2 for connection is used and the group of output electrodes of the circuit substrate 2 and a group of external lead-out electrodes of a flat display device 3 are thermally fused and adhered by way of the flexible circuit substrate for connection using a solder or the like or thermally pressed and adhered by way of an adhesive agent and an anisotropic conductive film formed from a conductive dispersing agent. As another example, as shown in FIG. 4, there is a method whereby the semiconductor devices 1 for driving are installed on the flexible circuit substrate 7 and a group of output electrodes formed at one end of the substrate 7 and a group of external lead-out electrodes of the display device 3 are connected by way of either one of the above-mentioned methods.

The foregoing methods have several problems, respectively.

(1) In the method using the anisotropic conductive rubber, the internal resistance is so high (over tens of ohms) that the electrical loss increases.

(2) In the thermal fusion and adhesion using a solder or the like, processing steps (plating and evaporation) of the electrode surfaces of the display device are needed, so that the steps become complicated and also only a limited electrode material can be used and the electrodes which have once been connected cannot be replaced.

(3) The anisotropic conductive film uses a resin as an adhesive material, so that heat resistance and moisture resistance are bad and a reliability remarkably deteriorates.

(4) For the flexible circuit substrate, the film serving as a base material of the substrate thermally contracts, so that a deviation in pitch occurs in the case where it is used for a display device with a narrow pitch and a large picture plane.

SUMMARY OF THE INVENTION

It is an object of the present invention to provide an electrode connection structure in which a film carrier on which semiconductor devices are installed and a connecting portion are integrated, and a package of the devices is reduced in size, and a high reliability, a low resistance, and a reduction in cost of the connecting portion are realized, and further the circuit substrate can be replaced.

A film carrier on which semiconductor devices are installed and which is excised to have a predetermined size and has leads in at least two directions is provided for a connecting frame member which has a cushion material at one end and in which a circuit substrate is fixed to the other end. The lead at one end of the film carrier is disposed on the cushion material and the opposite surface of this lead comes into contact with a group of external lead-out electrodes of a device mounted on the cushion material. The lead at the other end of the film carrier is connected to the circuit substrate and a supporting frame member is fixed to the connecting frame member so as to come into pressure contact with the opposite surfaces of a group of external lead-out electrodes of a flat device.

DESCRIPTION OF THE PREFERRED EMBODIMENTS

WORKING EXAMPLE

Figure 1:
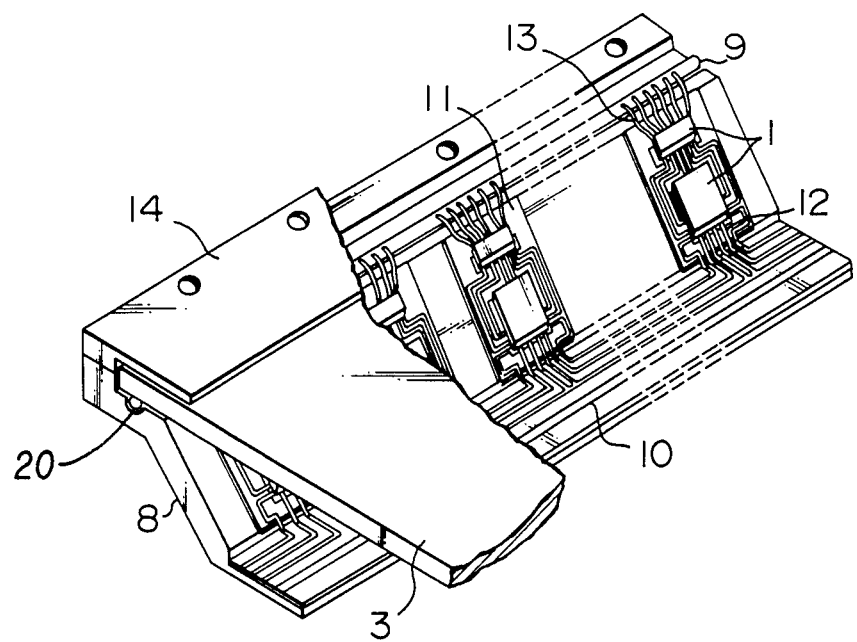
FIG. 1 is a perspective view showing the principal part of a flat display device in an embodiment of the present invention.
Figure 2:
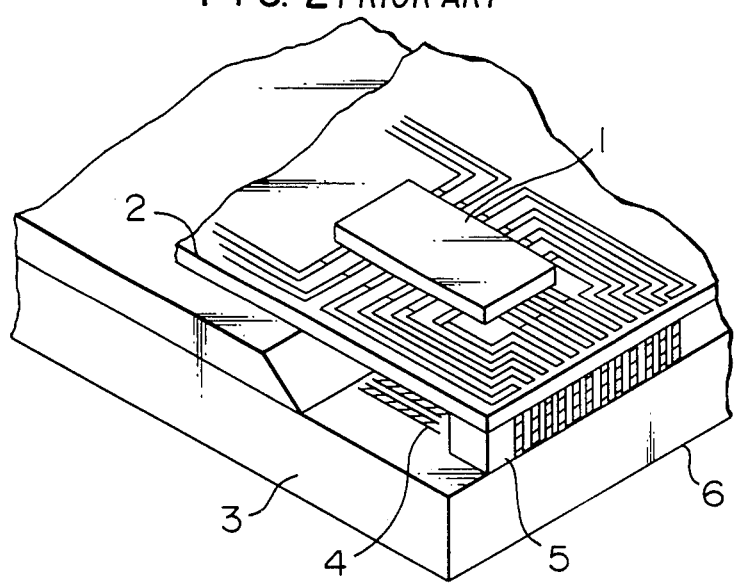
FIGS. 2 to 4 are perspective views showing conventional examples.
Figure 3:
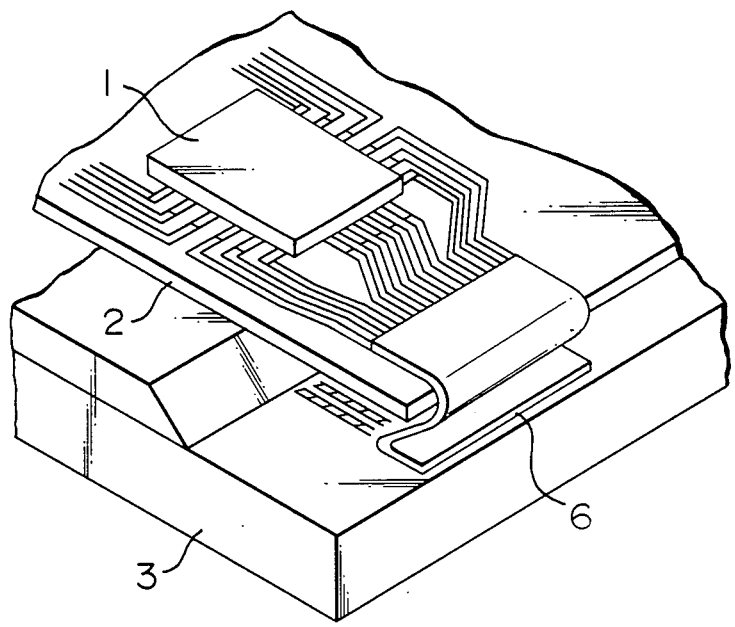
Figure 4:
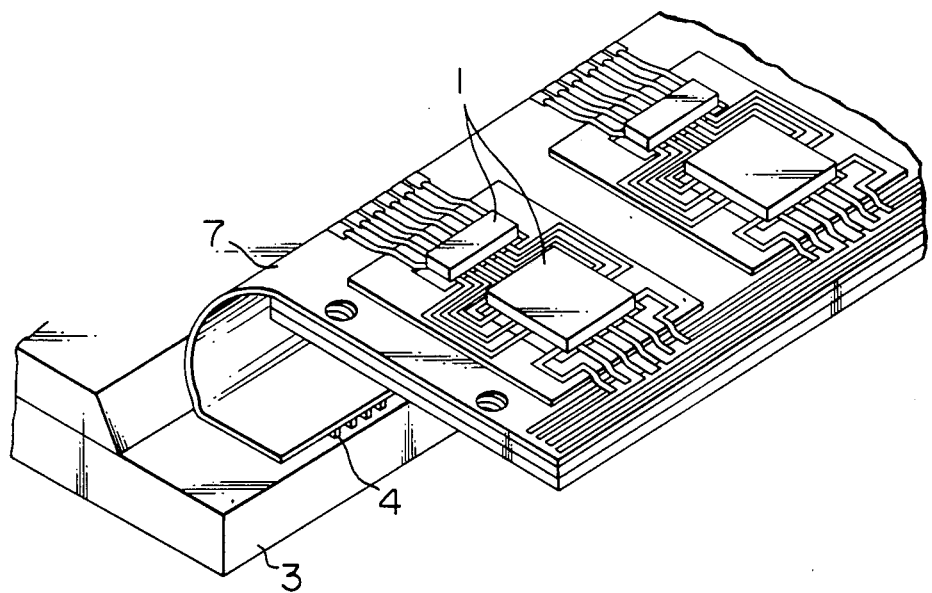

A fundamental arrangement of the present invention is shown in FIG. 1. A cushion material 9 is arranged at one end of a connecting frame member 8 and a circuit substrate 10 is fixed to the other end. A film carrier 11 on which the semiconductor devices 1 are installed is interposed between the cushion material 9 and the circuit substrate 10. Leads 12 are connected to the circuit substrate 10 and leads 13 are dispsed on the cushion material 9 and come into contact with a group of external lead-out electrodes of the flat display device 3 and is pressed and fixed to a supporting frame member 14 from the opposite surface.

The invention will now be practically described.

As a plate display device, an EL display having external lead-out electrodes of 1024 signal electrodes and 256 scanning electrodes at a pitch of 0.32 mm is used. Electrode materials are Cr and ITO, respectively.

The connecting frame member and supporting frame member made of Al are used, respectively. A groove 20 is formed in the connecting portion of the connecting frame member with the EL display and a silicon rod 9 (having a diameter of 2 mm) is inserted as a cushion material in this groove, while the circuit substrate is fixed to the opposite portion.

For the film carrier, a pattern is formed on a polyimide film and tin or gold is plated thereon. Bumps having a constitution of Ti - Pd - Au are formed on the electrodes of the semiconductor devices and connected to the film carrier by way of an alloy of Au - Sn or Au

- Cu, and thereafter it is excised so as to have a predetermined size.

Forty (eight on the scanning side and thirty-two on the signal side) film carriers are embedded in the groove formed in the connecting frame member and one end of the lead is disposed on the cushion material and the other end is connected to the circuit substrate. Then, the positions of a group of leads on the cushion material and a group of lead-out electrodes of the EL display are aligned. The supporting frame member and connecting frame member are fixed with screws.

The EL display installed in this manner was driven at a driving voltage 100 V and with the maximum current 80 mA, so that it could be preferably driven. At this time, the connection resistance value was below $1\Omega$. After the EL display was preserved for 1000 hours at a constant temperature of 125° C. and a constant temperature of 85° C. at a constant moisture of 85%, the connection resistance value was below twice the initial value.

Although the film carriers were fixed into the groove formed in the connecting frame member in the embodiment, they may be also fixed in a manner such that projections are formed on the connecting frame member and holes are formed in the film carriers in correspondence to the projections and the projections of the connecting frame member are inserted into the holes of the film carriers.

On one hand, although the connecting frame member was fixed to the supporting frame member with the screws in the embodiment, they may be constituted so that one can be fitted into the other or a fixing tool may be separately provided. Although the embodiment has been described with regard to the connecting frame member and supporting frame member made from Al, the invention is not limited to Al. They may be formed from Cu, SuS, iron, ceramics, a resin, or the like.

Although the flat display device has been described in the embodiment, the invention can be also similarly applied to a sensor array.

We claim:

1. An electrode connection arrangement comprising:
    a flat device having a first surface on which a plurality of electrodes are provided at the periphery thereof and a second surface opposite to said first surface;
    a plurality of film carriers each having at least one semiconductor device carried thereon and having leads at least provided at two end portions thereof; the leads at at least one of said end portions being in contact with respective ones of said plurality of electrodes of said flat device;
    a connecting frame member having a cushion material which is provided at a position where the electrodes of said flat device contact with the leads of said film carriers provided at said one end portion theroef, and a circuit substrate which is connected to the leads of said film carriers provided at the other end portions thereof;
    a supporting frame member secured to said connected frame member for supporting said flat device, said supporting frame member contacting with said second surface of said flat device;
    said film carriers being provided on said connecting frame member, one surface of said leads provided at said one end portion of said film carriers being positioned on said cushion material and an opposite surface of said leads being in contact with the respective electrodes of said flat device.

2. An electrode connection structure according to claim 1, wherein a groove is formed in said connecting frame member and a portion of said film carriers are embedded and positioned in this groove.

3. An electrode connection structure according to claim 1, wherein projections are formed on said connecting frame member and holes corresponding to said projections are formed in said film carriers.

* * * * *